US008368869B2

(12) United States Patent
Shiu et al.

(10) Patent No.: US 8,368,869 B2
(45) Date of Patent: Feb. 5, 2013

(54) LITHOGRAPHY APPARATUS WITH AN OPTICAL FIBER MODULE

(75) Inventors: Wei-Cheng Shiu, Taoyuan County (TW); Ya-Chih Wang, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 528 days.

(21) Appl. No.: 12/211,809

(22) Filed: Sep. 16, 2008

(65) Prior Publication Data
US 2010/0020298 A1   Jan. 28, 2010

(30) Foreign Application Priority Data

Jul. 25, 2008 (TW) ............................... 97128415 A

(51) Int. Cl.
*G02B 6/04* (2006.01)
*G02B 6/06* (2006.01)
*G03B 27/42* (2006.01)
*G03B 27/54* (2006.01)
*F21V 7/04* (2006.01)

(52) U.S. Cl. ............ 355/67; 355/53; 362/554; 385/115; 385/116; 385/119

(58) Field of Classification Search .... 250/492.1–492.2; 355/1, 53, 67, 72, 77; 359/355–360, 368–384, 359/642–830; 362/554–556; 385/115–121
See application file for complete search history.

(56) References Cited

U.S. PATENT DOCUMENTS

| | | | | |
|---|---|---|---|---|
| 5,121,256 A * | 6/1992 | Corle et al. | ............. | 359/664 |
| 5,939,623 A * | 8/1999 | Muramatsu et al. | ............. | 73/105 |
| 6,016,376 A * | 1/2000 | Ghaemi et al. | ............. | 385/116 |
| 6,097,473 A * | 8/2000 | Ota et al. | ............. | 355/53 |
| 7,006,741 B1 * | 2/2006 | Yu | ............. | 385/121 |
| 7,855,048 B1 * | 12/2010 | Tabery et al. | ............. | 430/396 |
| 2002/0006648 A1 | 1/2002 | Goodman | | |
| 2003/0076571 A1 * | 4/2003 | MacAulay et al. | ............. | 359/237 |
| 2005/0190435 A1 * | 9/2005 | Shafer et al. | ............. | 359/365 |
| 2006/0029884 A1 | 2/2006 | Hatakeyama | | |
| 2007/0091451 A1 * | 4/2007 | Schuster | ............. | 359/649 |

* cited by examiner

*Primary Examiner* — Hung Henry Nguen
*Assistant Examiner* — Colin Kreutzer
(74) *Attorney, Agent, or Firm* — Winston Hsu; Scott Margo

(57) ABSTRACT

A lithography apparatus with an optical fiber module includes: a light source, a photo mask positioned under the light source, a lens positioned under the photo mask, a wafer stage positioned under the lens for supporting the wafer, wherein the wafer includes a dry film. The lithography apparatus further includes an optical fiber module having a front surface facing away from the lens, wherein a gap is between the front surface and the dry film and the gap is smaller than the wavelength of the light source. The DUV (deep ultraviolet) can pass through the optical fiber module. The present invention features a gap smaller than the wavelength of the light source, creating a near-field effect with improved resolution.

18 Claims, 2 Drawing Sheets

LITHOGRAPHY APPARATUS WITH AN OPTICAL FIBER MODULE

BACKGROUND OF THE INVENTION

1. Field of the Invention

The present invention relates to a lithography apparatus, more particularly, to a lithography apparatus with an optical fiber module to improve the resolution of the lithography process.

2. Description of the Prior Art

Lithography process is important in transferring the circuit pattern onto the substrate. By projecting a light beam through the photo mask onto the photoresist, and then exposing, developing, and etching the substrate, the substrate which is uncovered by the photoresist is removed. In this way, the pattern can be transferred onto the remaining substrate. As the integrity of the IC increases, lithographic errors may easily happen. To correct these lithographic errors, immersion lithography is widely utilized in the semi-conductive field. Immersion lithography provides a possibility for increasing the resolution of an optical lithographic system. Immersion lithography is a technology in which lithographic exposure to be applied to a photoresist coated wafer is performed with a kind of immersion fluid, such as purified water, introduced between the projection lens of a stepper and the wafer. The wavelength of the light beam is shortened after passing through the immersion fluid, and the resolution of the lithographic exposure is therefore increased.

However, there are a few issues that need to be addressed in order for the promise of immersion lithography to materialize. For example, chemical substances such as photo acid generators (PAGs) leached from the photoresist to the wafer during exposure can adversely affect the image on the wafer. Furthermore, bubble generated in the immersion fluid may lead to patterns distortion. Moreover, the resolution of traditional immersion lithography is around 40 nm which is not good enough for the continuously shrinking trend of critical dimension.

SUMMARY OF THE INVENTION

Therefore, the present invention provides a lithography apparatus with an optical fiber module to replace the immersion fluid. In this way, the resolution can be enhanced by the near-field effect, and the traditional problem caused by the immersion fluid can be avoided.

According to a preferred embodiment of the present invention, a lithography apparatus is presented, and comprises: a light source, a photo mask positioned at the down stream of the light source, a lens positioned at the down stream of the photo mask, a wafer stage positioned at the down stream of the lens for supporting a wafer, wherein the wafer includes a dry film and an optical fiber module having a front surface facing away from the lens wherein a gap is between the front surface and the dry film and the gap is smaller than the wavelength of the light source to provide the near-field effect to improve the resolution.

According to another preferred embodiment of the present invention, a lithography apparatus is presented, and comprises: a light source, a photo mask positioned at the down stream of the light source, a lens positioned at the down stream of the photo mask, a wafer stage positioned at the down stream of the lens for supporting a wafer, wherein the wafer includes a dry film, the lithography apparatus characterized in that it has an optical fiber module having a front surface facing away from the lens, wherein a gap is between the front surface and the dry film and the gap is smaller than the wavelength of the light source to provide the near-field effect to improve the resolution.

According to the present invention, the gap between the optical fiber module and the dry film is smaller than the wavelength of the light source, therefore near-field effect is raised. Due to the near-field effect, a resolution which is much smaller than the wavelength of light source can be reached.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
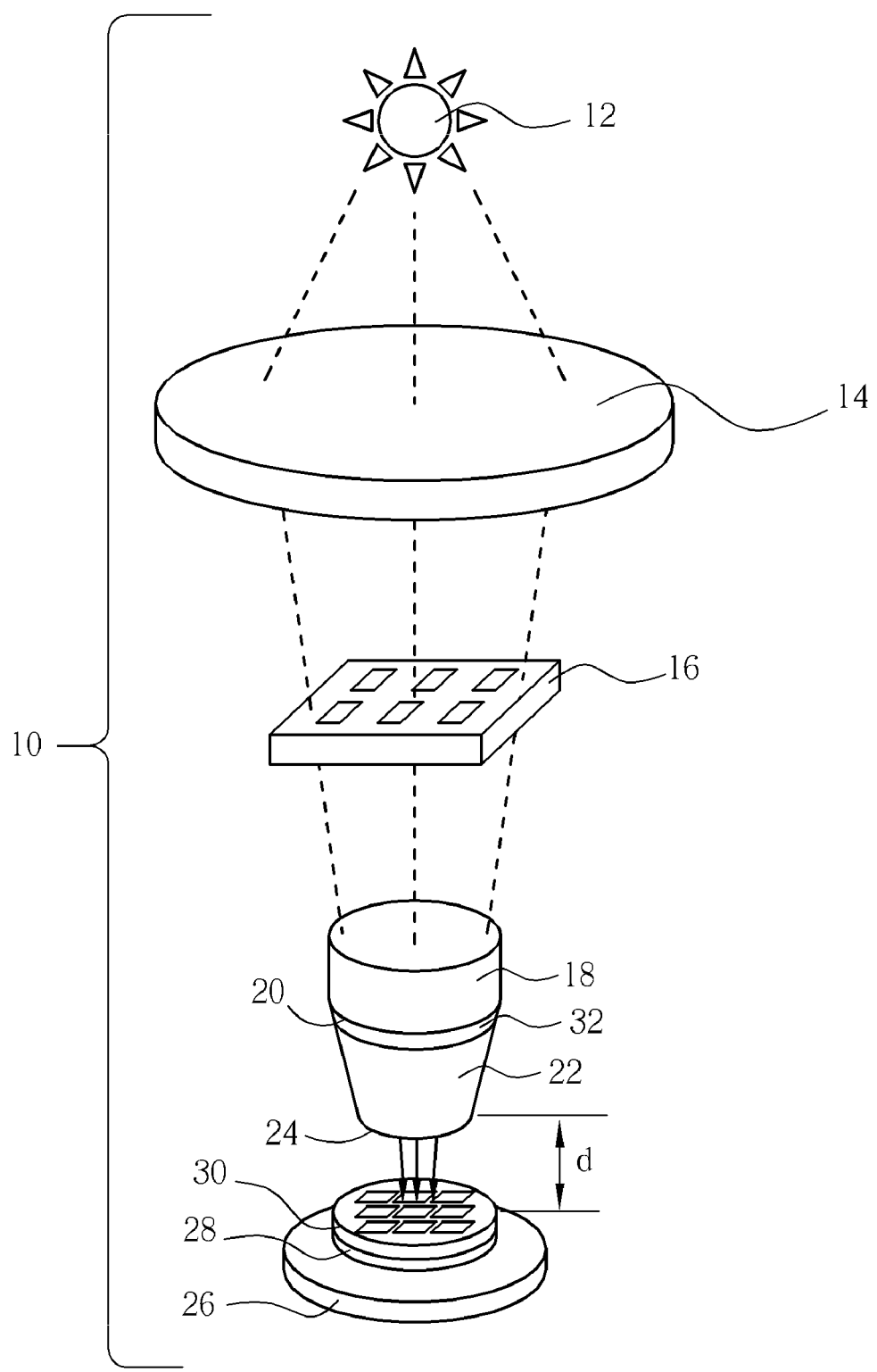
FIG. 1 depicts a schematic diagram of a lithography apparatus of the present invention.

Please refer to FIG. 1, a lithography apparatus 10 includes: a light source 12, a first lens 14 positioned at the down stream of the light source 12, a photo mask 16 positioned at the down stream of the first lens 14, a second lens 18 having a front surface 20 facing away from the photo mask 16, a wafer stage 26 positioned at the down stream of the second lens 18 for supporting a wafer 28, wherein the wafer 28 includes a dry film 30, an optical fiber module 22 having a front surface 24 facing away from the front surface 20 of the second lens 18 and positioned between the second lens 18 and the wafer stage 26. In addition, there is a gap d between the front surface 24 and the top surface of the dry film 30. It is noteworthy that the gap d is smaller than the wavelength of the light source 12 so as to provide the near-field effect to improve the resolution. According to a preferred embodiment, the light source 12 can be any suitable deep ultraviolet, such as ArF 193 nm excimer laser or KrF 248 nm excimer laser.

Furthermore, the optical fiber module 22 connects and covers the front surface 20 of the second lens 18 totally. In this way, the light beam penetrating the second lens 18 will enter entirely into the optical fiber module 22. An optical material 32 is positioned between the optical fiber module 22 and the second lens 18 as a transitional material. The optical material 32 can be selected from the group consisting of calcium fluoride, quartz, and other suitable materials which DUV (deep ultraviolet) can penetrate. The refractive index of the optical material 32 is between the refractive index of the optical fiber module 22 and the refractive index of the second lens 18 or is substantially close to the refractive index of the optical fiber module 22 or is substantially close to the refractive index of the second lens 18. Since the optical material 32 serving as a transitional material buffers the refractive index difference between the optical fiber module 22 and the second lens 18, when the light beam enters the optical fiber module 22 from the second lens 18, totally internal reflection does not usually occur.

Figure 2:
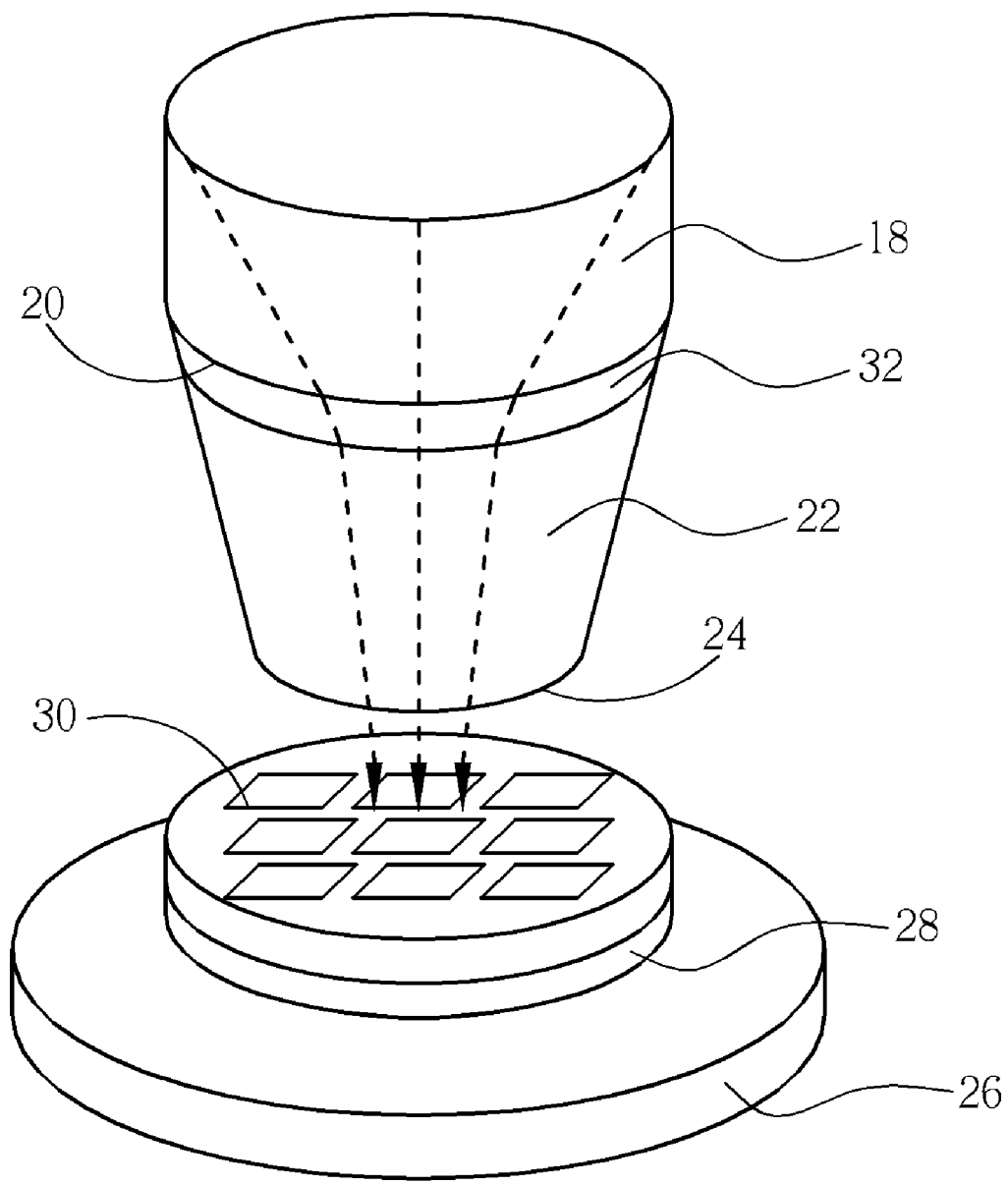
FIG. 2 is a magnified localized view of FIG. 1.

FIG. 2 is a magnified localized view of FIG. 1. The refractive index of the second lens 18 is smaller or substantially close to the optical material 32, and so the light beam penetrating through the second lens 18 and entering the optical material 32 will not be deflected from normal (not shown). In this way, the light beam can be directed into the optical fiber module more effectively. The optical fiber module can be constituted by an optical fiber or a bundle of optical fibers.

According to a preferred embodiment of the present invention, the density of the optical fiber bundle is $10^6$ fiber/mm$^2$.

Moreover, the dry film 30 can be a photoresist layer, or a photoresist layer covered by a high reflective material, such as an anti-reflective coating (ARC), a high-index spin-on organic material, or a high-index spin-on glass. The high reflective material can reduce the reflection from the dry film 30. Moreover, the wavelength of the light beam is decreased after passing the high reflective material. In this way, the resolution of the lithography apparatus can be enhanced. Furthermore, the thickness of the high reflective material is preferably smaller than the wavelength of the light source. The high reflective material can be removed by the developer, by dry etching, or by the CMP process.

In the present invention, the immersion fluid is replaced by the optical fiber module. Moreover, the gap d between the front surface of the optical fiber module and the dry film is smaller than the wavelength of the light source, so as to raise the near-field effect. By the near-field effect, lithography apparatus of the present invention is capable of producing a resolution smaller than 20 nm. Compared to immersion lithography, immersion fluid is no longer used in the present invention, thus distortion of the patterns due to the contaminated immersion fluid can be avoided. Moreover, the lithography apparatus with optical fiber module of the present invention can provide higher resolution than the conventional immersion lithography.

Besides, the optical fiber module is compatible with the conventional stepper machine, and the exposure method keeps the traditional step-and-scan process. Therefore, the lithography apparatus of the present invention can be easily applied to the production line.

Those skilled in the art will readily observe that numerous modifications and alterations of the device and method may be made while retaining the teachings of the invention.

What is claimed is:

1. A lithography apparatus comprising:
    a light source;
    a photo mask positioned at a down stream of the light source;
    a lens positioned at a down stream of the photo mask;
    a wafer stage positioned at a down stream of the lens for supporting a substrate; and
    an optical fiber module positioned between the lens and the wafer stage, wherein the optical fiber module comprises an optical fiber or a bundle of optical fibers substantially having a same packing density through the bundle, the optical fiber module has a front surface facing away from the lens, and wherein, the light source produces a light traveling from the light source, through the photo mask, the lens and the optical fiber module, and onto the substrate, the light has a wavelength, a gap is between the front surface and the substrate, a size of the gap relates to the wavelength, and the size of the gap is smaller than the wavelength of the light.

2. The lithography apparatus of claim 1, wherein the optical fiber module connects to the lens, and a light beam penetrating the lens enters entirely into the optical fiber module.

3. The lithography apparatus of claim 1, wherein the substrate comprises a wafer and a dry film on the wafer, and the dry film comprises a photoresist.

4. The lithography apparatus of claim 3, wherein the dry film further comprises a material, and the photoresist is positioned under the material.

5. The lithography apparatus of claim 4, wherein the material comprises an anti-reflective coating (ARC).

6. The lithography apparatus of claim 4, wherein the thickness of the material is smaller than the wavelength of the light source.

7. The lithography apparatus of claim 1, wherein the optical fiber module connects to the lens with an optical material positioned between the optical fiber module and the lens to serve as a transitional material.

8. The lithography apparatus of claim 7, wherein the refractive index of the optical material is between the refractive index of the optical fiber or the bundle of optical fibers and the refractive index of the lens.

9. The lithography apparatus of claim 7, wherein, the optical material comprises calcium fluoride or quartz, and the light comprises a deep ultraviolet light.

10. A lithography apparatus with an optical fiber module comprising a light source, a photo mask positioned at a down stream of the light source, a lens positioned at a down stream of the photo mask, a wafer stage positioned at a down stream of the lens for supporting a substrate, the lithography apparatus characterized in that:
    an optical fiber module positioned between the lens and the wafer stage, the optical fiber module comprising an optical fiber or a bundle of optical fibers substantially having a same packing density through the bundle, the optical fiber module having a front surface facing away from the lens, wherein, a gap is between the front surface and the substrate, the light source produces a light traveling from the light source, through the photo mask, the lens and the optical fiber module, and to the substrate, the light has a wavelength, a size of the gap relates to the wavelength, and the size of the gap is smaller than the wavelength of the light.

11. The lithography apparatus of claim 10, wherein the optical fiber module connects to the lens, and a light beam penetrating the lens enters entirely into the optical fiber module.

12. The lithography apparatus of claim 10, wherein the substrate comprises a wafer and a dry film on the wafer, and the dry film comprises a photoresist.

13. The lithography apparatus of claim 12, wherein the dry film further comprises a material, and the photoresist is positioned under the material.

14. The lithography apparatus of claim 13, wherein the material comprises an anti-reflective coating (ARC).

15. The lithography apparatus of claim 13, wherein the thickness of the material is smaller than the wavelength of the light source.

16. The lithography apparatus of claim 10, wherein the optical fiber module connects to the lens with an optical material positioned between the optical fiber module and the lens to serve as a transitional material.

17. The lithography apparatus of claim 16, wherein the refractive index of the optical material is between the refractive index of the optical fiber or the bundle of optical fibers and the refractive index of the lens.

18. The lithography apparatus of claim 16, wherein, the optical material comprises calcium fluoride or quartz, and the light comprises a deep ultraviolet light.

* * * * *